United States Patent
Go

(10) Patent No.: US 7,901,972 B2
(45) Date of Patent: Mar. 8, 2011

(54) CAMERA MODULE AND METHOD OF MANUFACTURING THE SAME

(75) Inventor: Min Chul Go, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 165 days.

(21) Appl. No.: 12/289,471

(22) Filed: Oct. 28, 2008

(65) Prior Publication Data
US 2010/0034531 A1 Feb. 11, 2010

(30) Foreign Application Priority Data
Aug. 6, 2008 (KR) .................. 10-2008-0077148

(51) Int. Cl.
*H01L 21/00* (2006.01)
(52) U.S. Cl. .......................... 438/64; 438/65; 438/116
(58) Field of Classification Search .................. None
See application file for complete search history.

(56) References Cited

U.S. PATENT DOCUMENTS 7,199,359 B2 * 4/2007 Webster .................. 250/239
2006/0006486 A1 * 1/2006 Seo et al. .................. 257/433

FOREIGN PATENT DOCUMENTS

JP 2007-264116 10/2007
KR 10-2007-0093168 9/2007

* cited by examiner

*Primary Examiner* — Scott B Geyer

(57) ABSTRACT

Provided is a method of manufacturing a camera module, the camera module including a housing that includes one or more lenses which are sequentially fixed and coupled and of which the focus does not need to be adjusted; a holder assembly that is coupled to a lower end portion of the housing; and a main substrate that is coupled to a lower end portion of the holder assembly. The method comprises providing bonding media for bonding the main substrate through a reflow process such that the bonding media are disposed on a lower surface of a holder substrate composing the lower end portion of the holder assembly, and fixing an image sensor on an upper surface of the holder substrate through wire bonding; mounting a holder formed of a ceramic material so as to surround the image sensor wire-bonded to the holder substrate; mounting an IR filter on the holder so as to seal an internal space of the holder, which is defined by the holder substrate and the holder and in which the image sensor is included, thereby completely manufacturing the holder assembly; bonding the holder assembly to the main substrate through a reflow process; and performing fine focus adjustment while sliding the housing into the housing mounting portion formed at the upper end portion of the holder body coupled to the main substrate.

3 Claims, 8 Drawing Sheets

[FIG. 1]
<u>10</u>
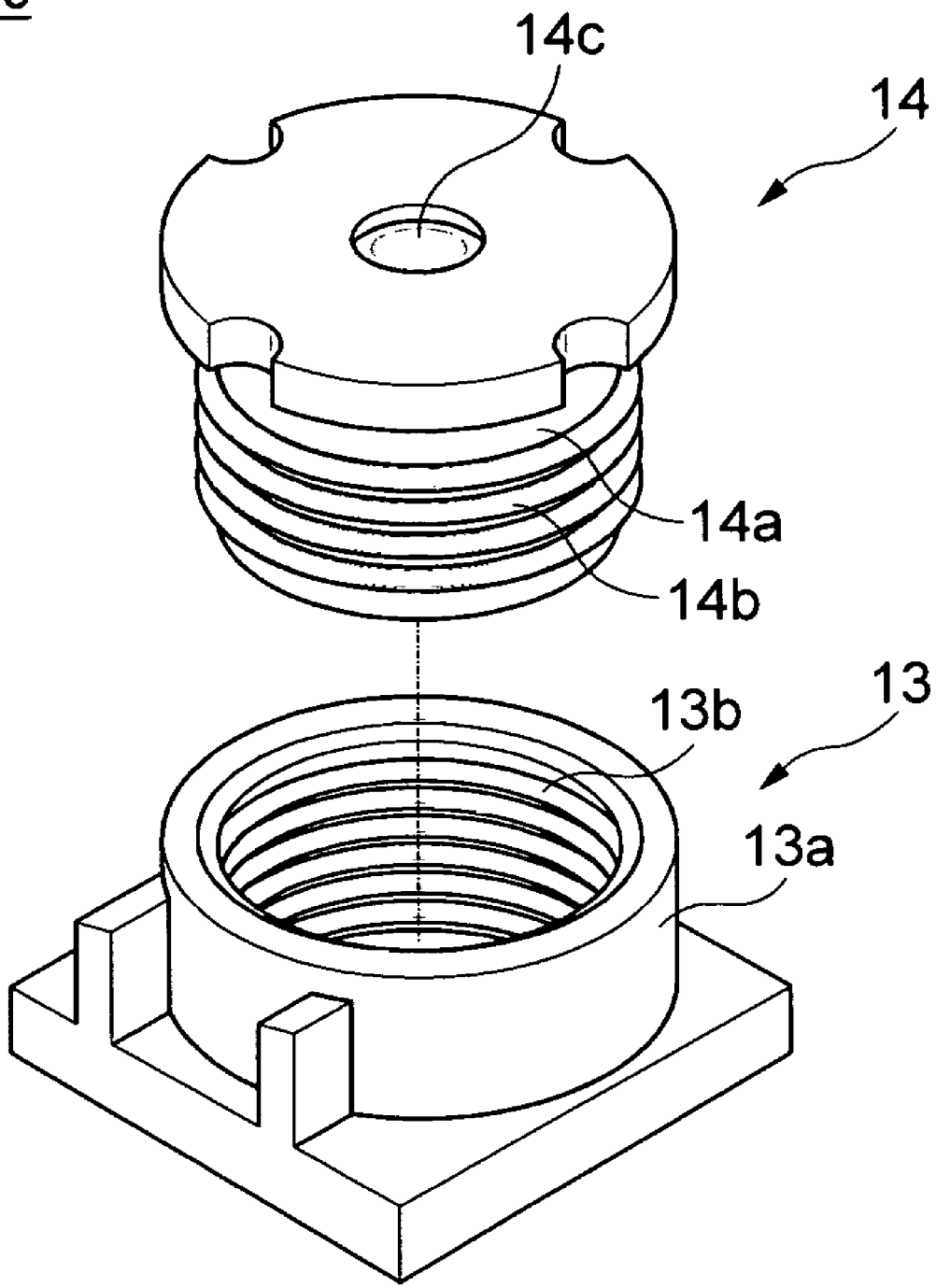
- PRIOR ART -

[FIG. 2]
10
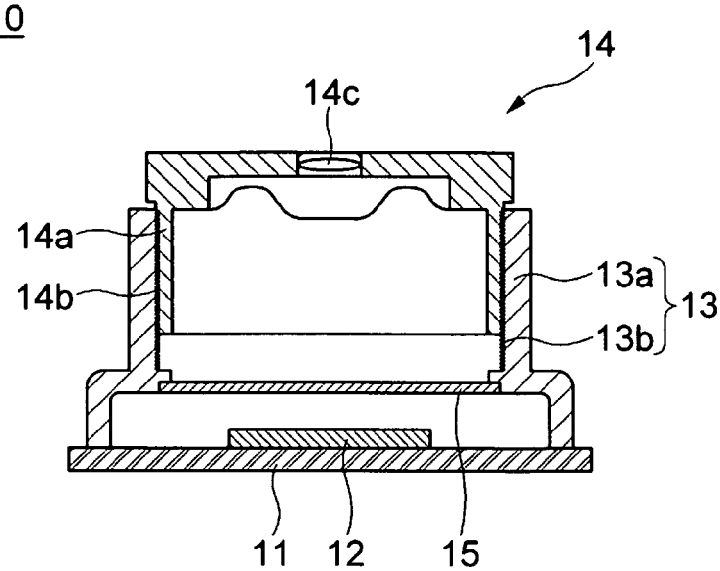
- PRIOR ART -
[FIG. 3]
30
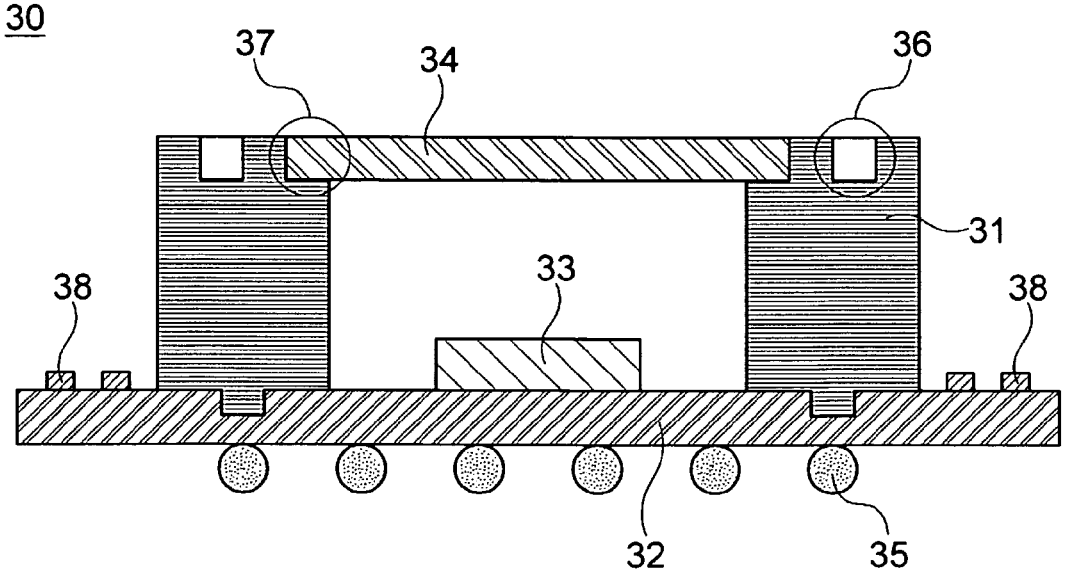

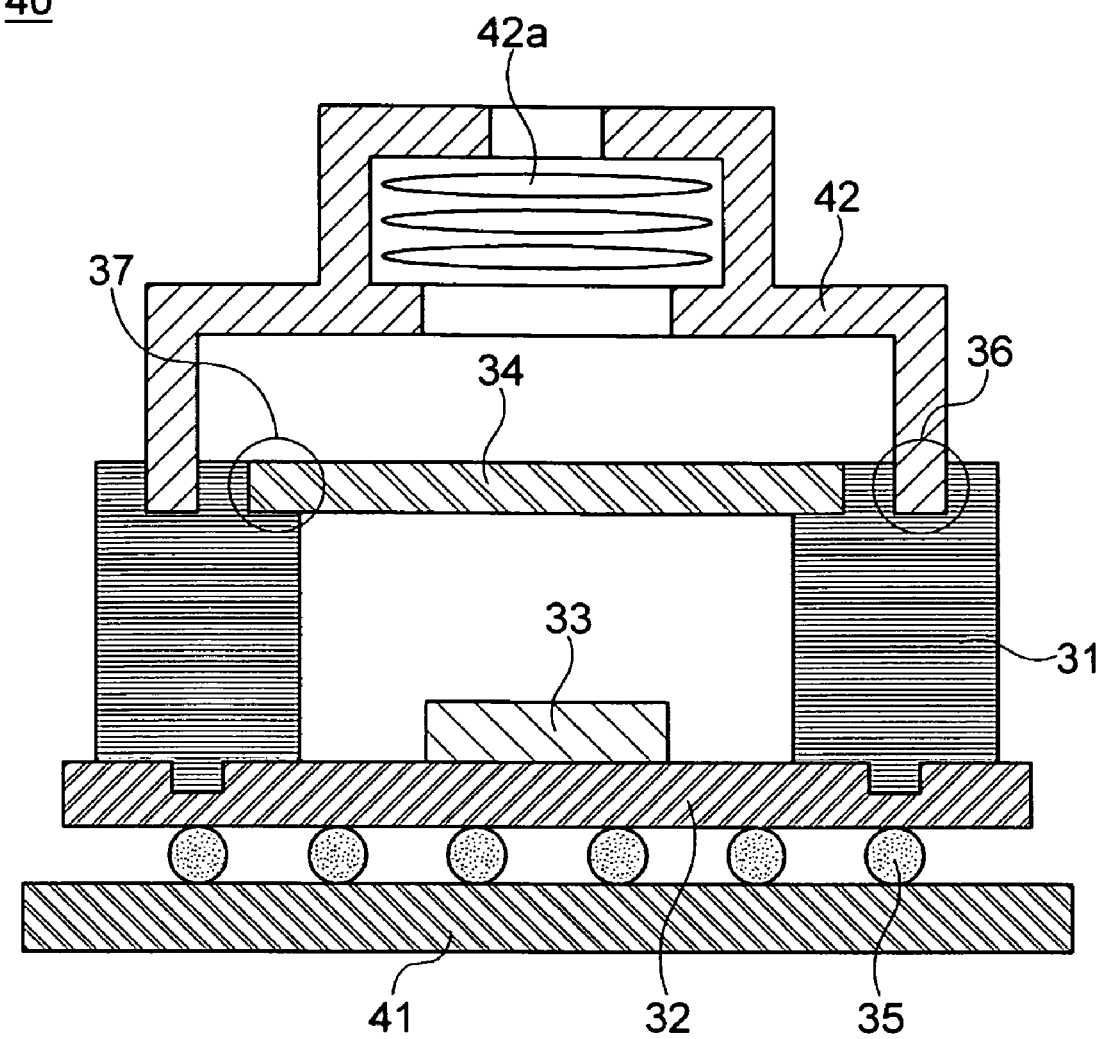
[FIG. 4]

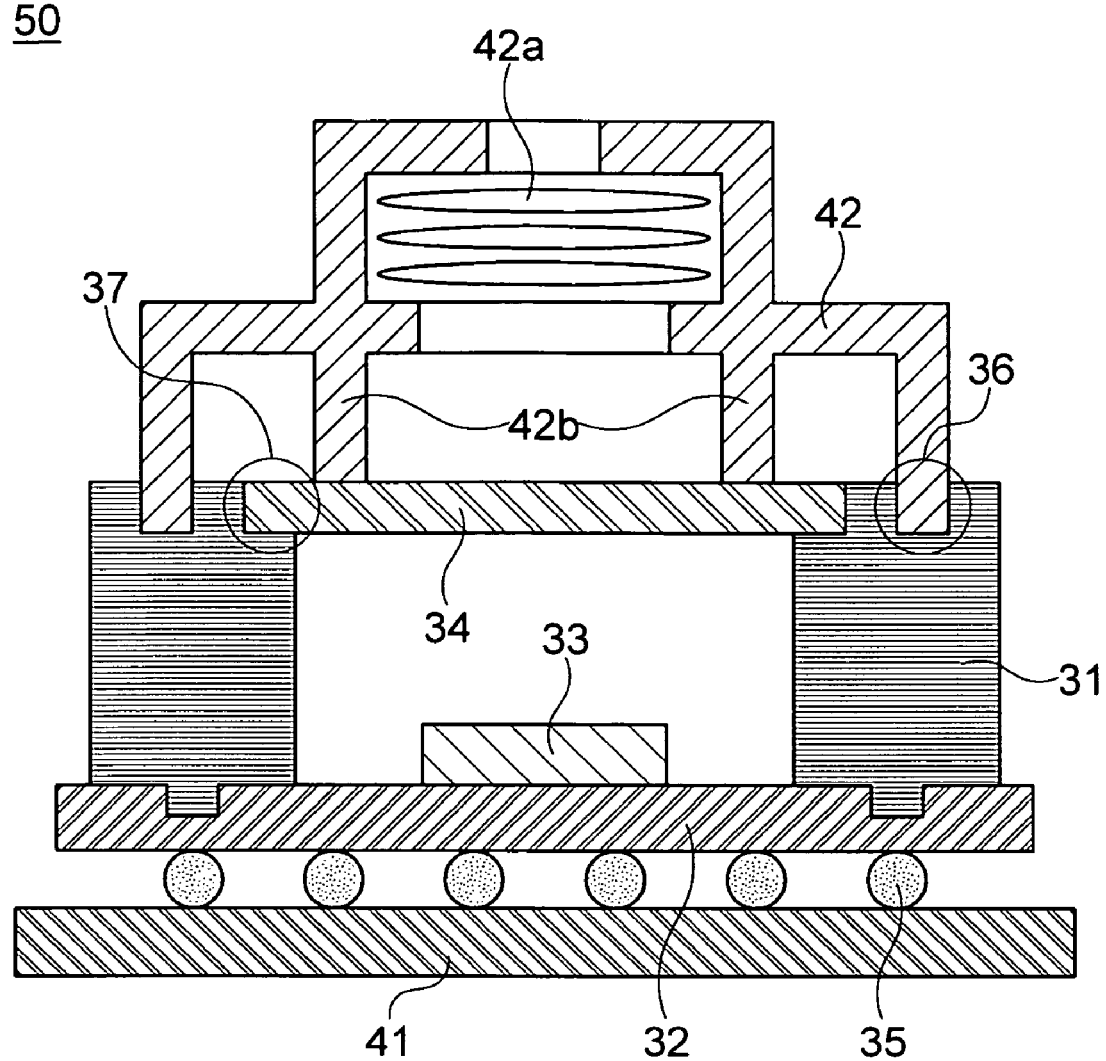
[FIG. 5]

[FIG. 6]
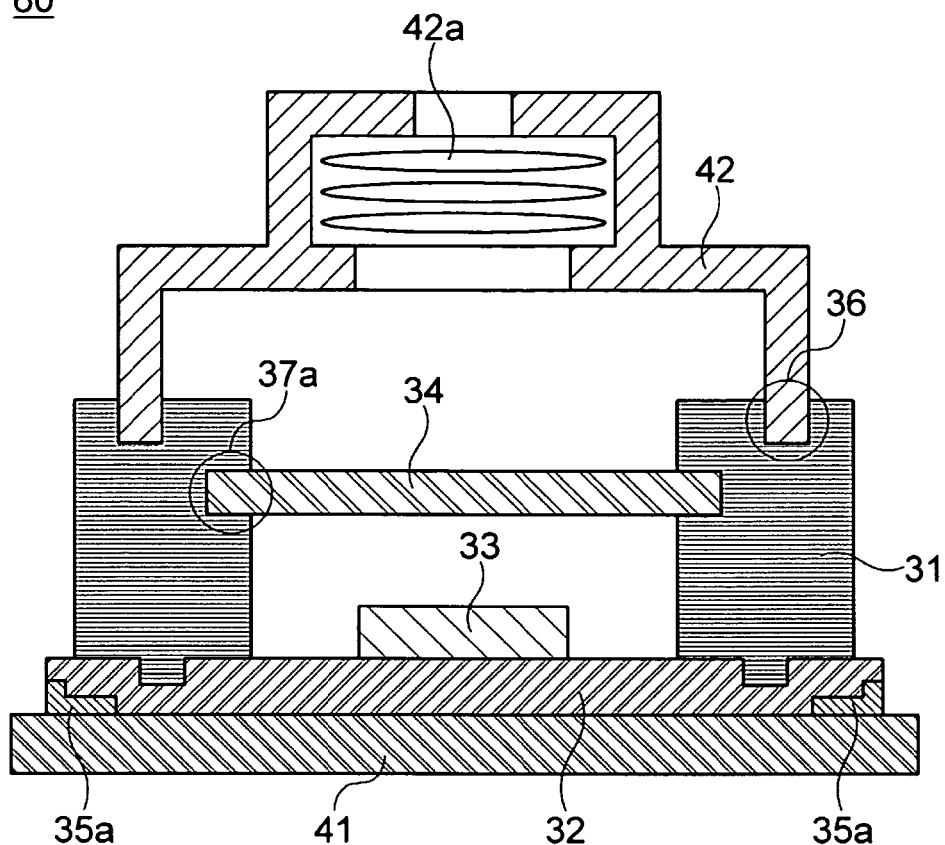
[FIG. 7A]
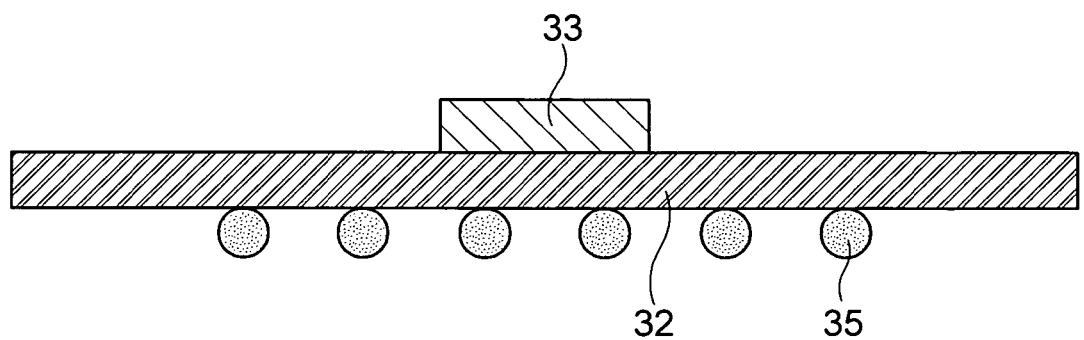

[FIG. 7B]
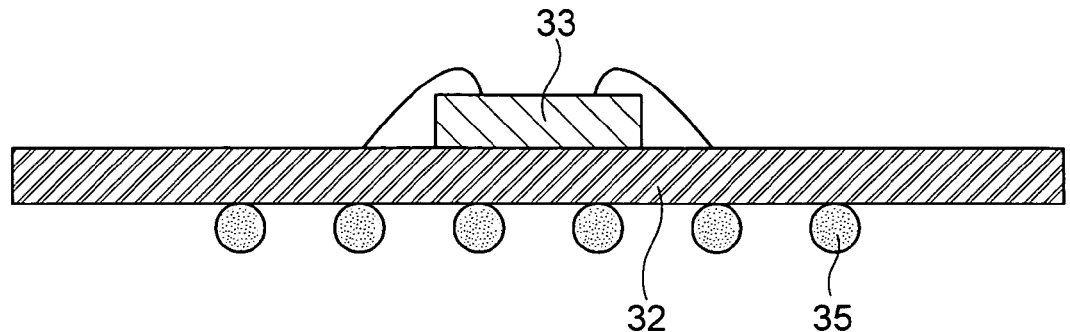
[FIG. 7C]
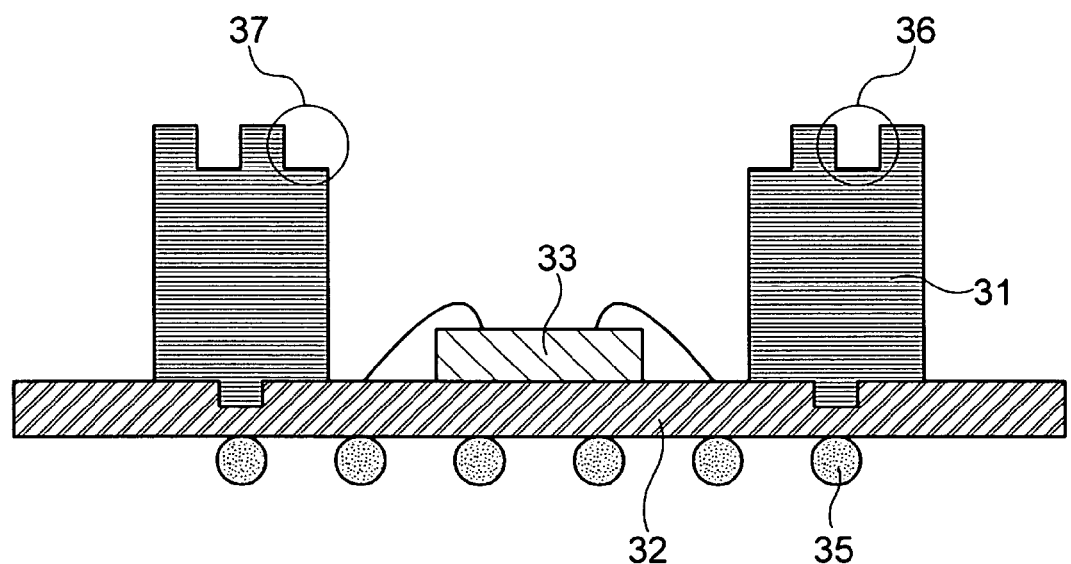
[FIG. 7D]
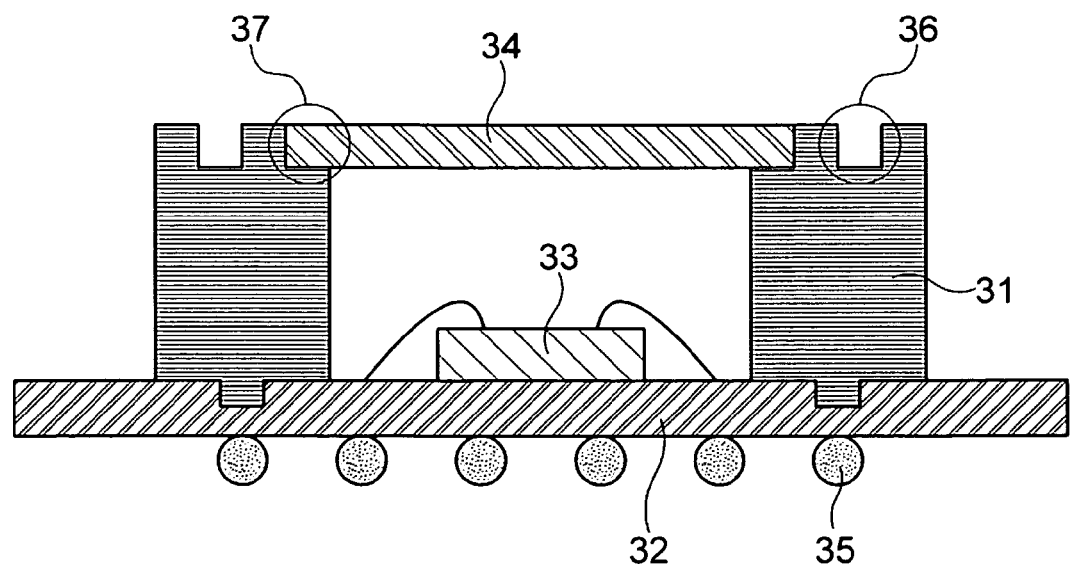

[FIG. 7E]
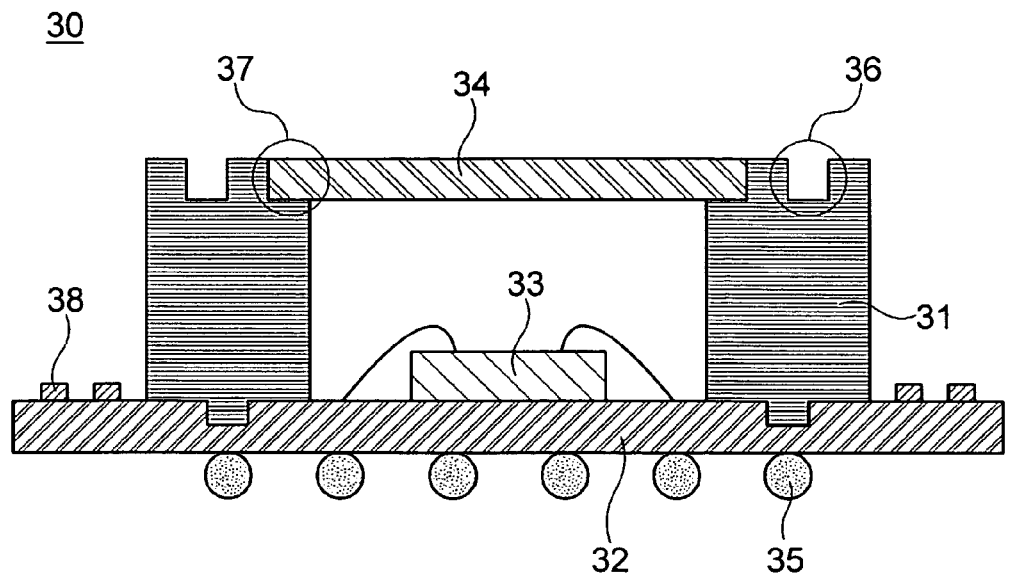
[FIG. 7F]
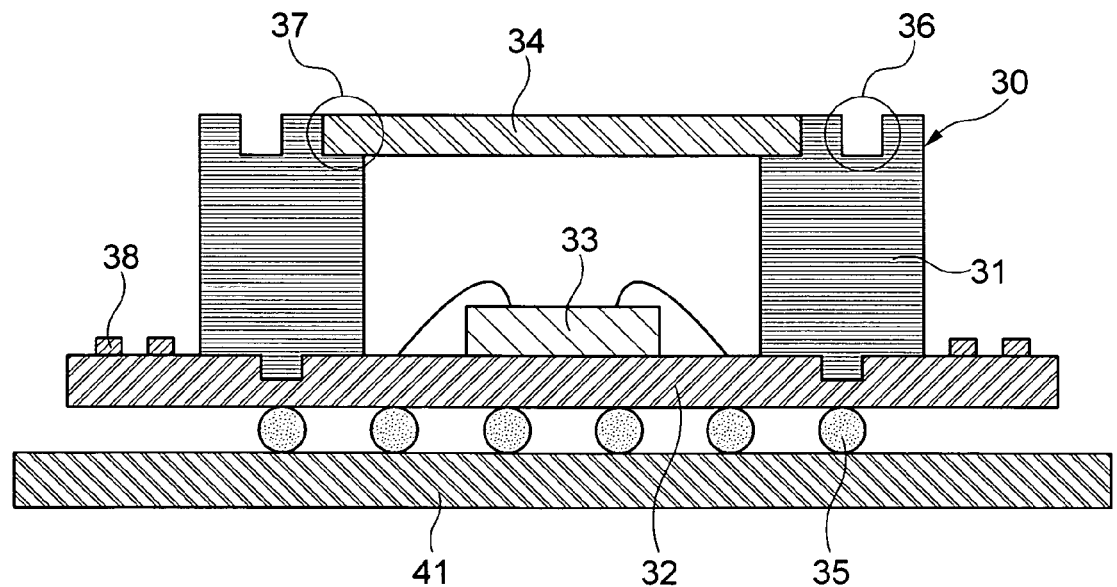

[FIG. 7G]
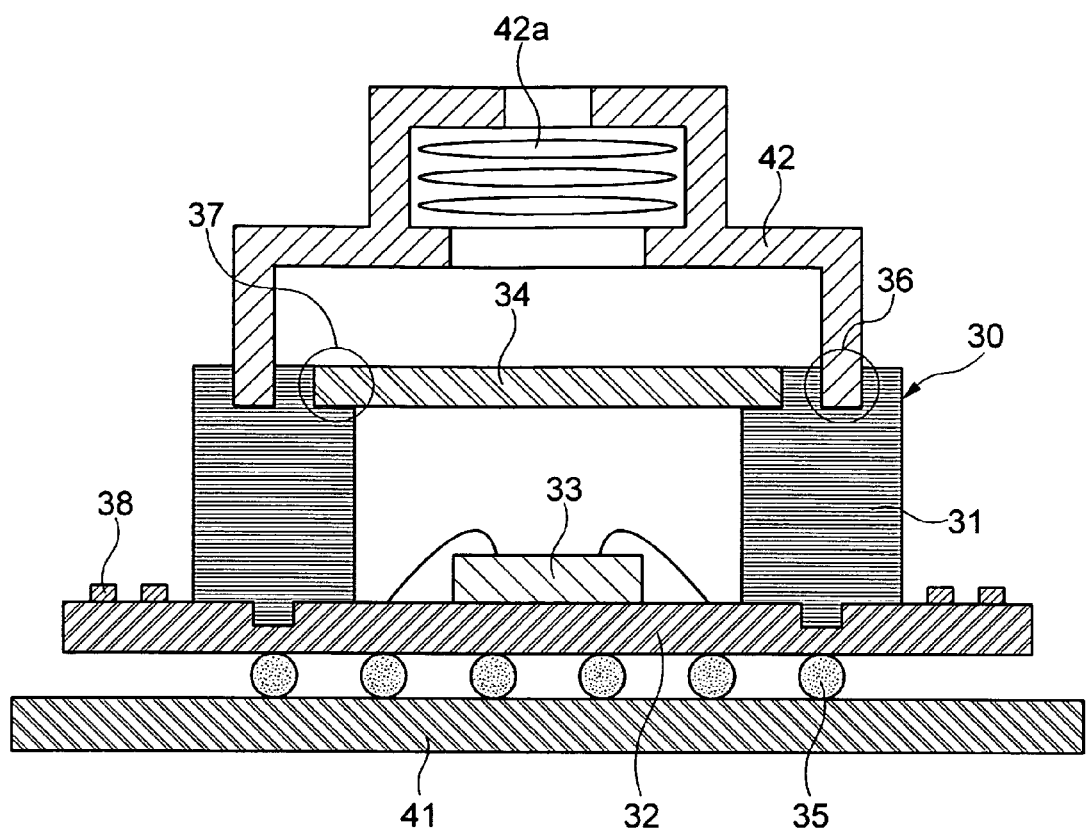

CAMERA MODULE AND METHOD OF MANUFACTURING THE SAME

CROSS-REFERENCE TO RELATED APPLICATIONS

This application claims the benefit of Korean Patent Application No. 10-2008-0077148 filed with the Korean Intellectual Property Office on Aug. 6, 2008, the disclosure of which is incorporated herein by reference.

BACKGROUND OF THE INVENTION

1. Field of the Invention

The present invention relates to a camera module and a method of manufacturing the same.

2. Description of the Related Art

Recently, camera modules are mounted on IT devices such as mobile terminals, PDAs (Personal Digital Assistant), MP3 players and so on. With the development of technology, the resolution of the camera modules changes from 300,000 pixels (VGA) to several million pixels, and the reduction in size and thickness of the camera modules are being performed depending on mounting targets. Further, the camera module provides various additional functions, such as auto-focusing (AF) and optical zoom.

The camera modules are manufactured by using main parts of charge coupled device (CCD) or complementary metal oxide semiconductor (CMOS) image sensors. Incident light transmitted through the lens is condensed by the image sensor and is stored as data in a memory. The stored data is displayed as an image through a display medium, such as liquid crystal display (LCD) or PC monitor.

Typical camera modules are manufactured by a chip-on-film (COF) method, a chip-on-board (COB) method and the like. The COB method will be described with reference to drawings.

FIG. 1 is an exploded perspective view of a conventional camera module manufactured by the COB method, and FIG. 2 is a cross-sectional view of the conventional camera module.

In the conventional camera module 10, a printed board 11 having a CCD or CMOS image sensor 12 mounted thereon through wire bonding is coupled to a lower end portion of a housing 13 formed of plastic, and a lens barrel 16 having a cylindrical body 14a extending downward is coupled to a lower end portion of a barrel 13a extending upward from the housing 13.

In the camera module 10, the housing 13 and the lens barrel 14 are coupled to each other by coupling a female screw portion 13b formed on the inner circumferential surface of the barrel 13a to a male screw portion 14b formed on the outer circumferential surface of the cylindrical body 14a.

Further, an IR filter 15 is interposed between a lens 14c mounted in the lens barrel 14 and the image sensor 12 attached on the upper surface of the printed board 11 so as to cut off excessive long-wavelength infrared rays incident on the image sensor 12.

In the camera module assembled in such a manner, while light incident from a specific object passes through the lens 14c, an image is inverted so that the focus is adjusted on the surface of the image sensor 12. At this time, when a focus is optimally adjusted while the lens barrel 14 screwed to the upper end of the housing 13 is rotated, an adhesive is injected between the barrel 13a of the housing 13 and the lens barrel 14 such that the housing 13 and the lens barrel 14 are bonded to each other. Then, the camera module is finalized.

In the camera module manufactured by the COB method, the lens barrel 14 is inserted into the upper opening of the housing 13 such that the lens barrel 14 and the housing 13 are closely coupled to each other through the screw coupling using the female and male screw portions 13b and 14b formed on the inner and outer circumferential surfaces of the housing 13 and the lens barrel 14. As height adjustment is performed by rotating the lens barrel 14 at the upper end portion of the housing 13, focus adjustment between the lens 14c within the lens barrel 14 and the image sensor 12 mounted on the printed board 11 is achieved.

Therefore, in the conventional camera modules manufactured by the above-described assembling method, when the housing 13 and the lens barrel 14 are vertically coupled, and if the female and male screws 13b and 14b are engaged at a distorted angle, screw threads may be broken or the coupling portion may be worn away by the friction between the female and male screws 13b and 14b. Then, foreign matters such as minute particles may occur, thereby degrading the assembling property.

Further, the particles occurring between the housing 13 and the lens barrel 14 inevitably fall onto the upper surface of the IR filter 14 or the light receiving region of the image sensor 12, because the housing 13 is rocked left and right when the focus adjustment is performed by rotating the lens barrel 14 mounted on the upper end portion of the housing 13. Therefore, when an image is reproduced by the image sensor 12, the particles have a large effect on the image.

Further, since the housing 13 and the lens barrel 14 are coupled though the male and female screws, the lens may be tilted along a spiral angle formed in the lens barrel 14 when the lens barrel 14 is rotated along the spiral contact surface.

Once foreign matters fall onto the lens 14c or the image sensor 12, they cannot be simply removed. Therefore, the camera module 10 in which the foreign matters have occurred should be discarded as a whole. As a result, the expensive lens 14c or the image sensor 12 is also discarded.

Further, since the housing 13 having the IR filter 15 coupled thereto is mounted on the printed board 11 after the image sensor 12 is wire-bonded to the printed board 11, movable foreign matters may fall into the housing 13, or specifically onto the upper end portion of the image sensor 12 such that defects frequently occur. Furthermore, since passive elements (not shown in FIG. 1) are mounted around the image sensor 12, flux or other foreign matters frequently occur.

Further, in order to quickly respond to users' request which changes day by day, a sample manufacturing schedule needs to be reduced by standardizing a camera module.

SUMMARY OF THE INVENTION

An advantage of the present invention is that it provides a camera module which adopts a holder assembly which has an image sensor and an IR filter mounted therein and is formed of a ceramic material, thereby minimizing defects caused by foreign matters. Since the holder assembly is previously manufactured, it is possible to quickly respond to users' requests. Further, as a reflow process is adopted, it is possible to simplify the manufacturing process. Further, when defects occur in the camera module, a rework operation can be easily performed, and the manufacturing cost can be reduced.

Another advantage of the invention is that it provides a method of manufacturing a camera module.

Additional aspect and advantages of the present general inventive concept will be set forth in part in the description which follows and, in part, will be obvious from the description, or may be learned by practice of the general inventive concept.

According to an aspect of the invention, there is provided a method of manufacturing a camera module, the camera module including a housing that includes one or more lenses which are sequentially fixed and coupled and of which the focus does not need to be adjusted; a holder assembly that is coupled to a lower end portion of the housing; and a main substrate that is coupled to a lower end portion of the holder assembly. The method comprises providing bonding media for bonding the main substrate through a reflow process such that the bonding media are disposed on a lower surface of a holder substrate composing the lower end portion of the holder assembly, and fixing an image sensor on an upper surface of the holder substrate through wire bonding; mounting a holder formed of a ceramic material so as to surround the image sensor wire-bonded to the holder substrate; mounting an IR filter on the holder so as to seal an internal space of the holder, which is defined by the holder substrate and the holder and in which the image sensor is included, thereby completely manufacturing the holder assembly; bonding the holder assembly to the main substrate through a reflow process; and performing fine focus adjustment while sliding the housing into the housing mounting portion formed at the upper end portion of the holder body coupled to the main substrate.

The housing may include a support portion which extends from an inner lower end of the housing so as to come in contact with the upper end portion of the holder assembly. The support portion may be provided so as to be disposed on an upper end portion of the IR filter.

The method further comprises providing passive elements on the holder substrate such that the passive elements are positioned outside the holder, before the bonding of the holder assembly to the main substrate.

According to another aspect of the invention, a camera module comprises a housing that includes one or more lenses which are sequentially fixed and coupled and of which the focus does not need to be adjusted; a holder assembly that is coupled to a lower end portion of the housing; and a main substrate that is coupled to a lower end portion of the holder assembly through a reflow process. The holder assembly includes a holder including: a housing mounting portion that is formed on an upper end portion of the holder such that fine focus adjustment can be performed in a sliding manner when the holder assembly is coupled to the lower end portion of the housing; and a filter mounting portion that is formed in such a manner that an internal space of the holder is sealed by an IR filter, the holder being formed of a ceramic material on which a reflow process can be performed; the IR filter that is mounted on the filter mounting portion formed in the holder; and a holder substrate that is coupled to a lower end portion of the holder and includes an image sensor fixed on an upper surface thereof through wire bonding and bonding media for bonding the main substrate through a reflow process, the bonding media being provided on a lower surface of the holder substrate.

The housing may include a support portion which extends from an inner lower end of the housing so as to come in contact with the upper end portion of the holder assembly. The support portion may extend so as to be disposed on an upper end portion of the IR filter.

The filter mounting portion may be formed on an inner surface of the upper end portion of the holder.

The filter mounting portion may be formed on an inner surface of a middle portion of the holder.

The camera module further comprises passive elements that are provided on the holder substrate so as to be positioned outside the holder.

The bonding media formed on the lower surface of the holder substrate may be solder balls or pads.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is an exploded perspective view of a conventional camera module manufactured by the COB method;

FIG. 2 is a cross-sectional view of the conventional camera module;

FIG. 3 is a cross-sectional view of a holder assembly according to a first embodiment of the invention;

FIG. 4 is a cross-sectional view of a camera module 40 according to a second embodiment of the invention;

FIG. 5 is a cross-sectional view of a camera module 50 according to a third embodiment of the invention;

FIG. 6 is a cross-sectional view of a camera module 60 according to a fourth embodiment of the invention; and FIGS. 7A to 7G are process diagrams sequentially showing a method of manufacturing a camera module according to the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a camera module and a method of manufacturing the same according to the present invention will be described in detail with reference to the accompanying drawings.

Camera Module

First Embodiment

FIG. 3 is a cross-sectional view of a holder assembly according to a first embodiment of the invention.

The hold assembly 30 shown in FIG. 3 includes a holder 31, a holder substrate 32, an image sensor 33, an IR filter 34, and bonding media 35 for a reflow process.

First, the holder 31 formed in a cylindrical shape is mounted so as to surround the image sensor 33 fixed on the holder substrate 32 through wire bonding. In the first embodiment, when a housing (not shown in FIG. 3) including a lens is coupled to the holder assembly 30, a lower end portion of the housing and an upper end portion of the holder assembly 30 are coupled in a sliding manner. Therefore, a housing mounting portion 36 is formed along the circumferential surface of the upper end of the holder 31.

Further, a stepped filter mounting portion 37 is formed along the inner circumferential surface of the upper end of the holder 31, and the IR filter 34 is mounted on the filter mounting portion 37. For example, the IR filter 34 is fixed to the holder 31 through an adhesive such as ultraviolet (UV) bond. Therefore, the depth of the filter mounting portion 37 within the holder 31 corresponds to the height of the IR filter 34.

The IR filter 34 serves to cut off excessive infrared rays incident on the image sensor 33 and to 'seal' the holder assembly 30. In other words, the IR filter 34 serves as a cover glass for protecting the image sensor 33 within the holder assembly 30 from external contaminants which may occur during a variety of processes to be subsequently performed, even though it will be described below in a method of manufacturing a camera module.

Meanwhile, the lower end portion of the holder 31 is coupled to the holder substrate 32. The image sensor 33 is fixed on the upper surface of the holder substrate 32 through wire bonding, and the bonding media 35 for bonding a main substrate 41 (refer to FIG. 4) are provided on the lower surface of the holder substrate 32. For example, solder balls or pads are provided as the bonding media 35 for a reflow process.

In the first embodiment, the main substrate 41 and the holder assembly 30 are previously bonded to each other through a reflow process before the housing 42 (refer to FIG. 4) is coupled. In the conventional COB method, the process for bonding the camera module to the main substrate is separately performed. In the reflow process according to the invention, however, the bonding media 35 are previously mounted between the holder assembly 30 and the main substrate 41 such that a plurality of holder assemblies 30 can be bonded to a plurality of main substrates through one process. Therefore, it is possible to simplify the manufacturing process.

However, since a general reflow process is performed at a high temperature of about 250° C., it was difficult to apply the reflow process to a camera module which is manufactured by the COB method and uses a housing formed of plastic such as PVC.

Therefore, in this embodiment, the holder 31 is formed of a ceramic substrate on which the reflow process can be performed. Accordingly, only the holder assembly 30 can be attached to the main substrate 41 through the reflow process, before the housing 42 including lenses 42*a* is installed.

Further, passive elements 38 such as a capacitor, an inductor, and a resistor are mounted on the holder substrate 32 so as to be disposed outside the holder 31. When the passive elements are mounted around the image sensor 33, foreign matters may have an effect upon the image sensor 33. In this embodiment, however, since the passive elements 38 are isolated from the image sensor 33 within the holder 31, it is possible to minimize the contamination of the image sensor 33 caused by the occurrence of foreign matters.

According to this embodiment, a standardized and commonly-used module can be previously manufactured as the holder assembly 30 so as to be mounted on the main substrate 41 depending on a user's request, which makes it possible to quickly respond to the user's request. Therefore, it is possible to reduce the manufacturing time.

Further, in the conventional camera module, individual components were sequentially assembled. In this embodiment, however, since the holder assembly 30 is previously manufactured, the manufacturing process can be simplified. Further, a rework operation can be easily performed when defects occur in the camera module, and the lenses or image sensor can be reused.

Second Embodiment

FIG. 4 is a cross-sectional view of a camera module 40 according to a second embodiment of the invention.

In this embodiment, the descriptions of the same technical construction as that of the first embodiment will be omitted, and like reference numerals will be attached to the same components.

The camera module 40 according to the second embodiment includes a main substrate, a housing 42, and the holder assembly 30 described in the first embodiment.

First, the holder assembly 30 is mounted on the main substrate 41, and a reflow process is then performed. In general, since the reflow process is performed at a high temperature of about 250° C., the reflow process is performed before the housing formed of plastic such as PVC is mounted on the holder assembly 30.

After the holder assembly 30 is bonded to the main substrate 41, the housing 42 is mounted on the upper end portion of the holder assembly 30. The housing 42 includes one or more lenses 42*a* which are sequentially fixed and coupled and of which the focus does not need to be adjusted. At this time, the housing 42 is inserted into the housing mounting portion 36 of the holder 31 while being adjusted in a sliding manner. Therefore, the depth of the housing mounting portion 36 is designed in such a manner that a focal distance (that is, a distance from the lower end of the lens to the upper end of the image sensor) can be adjusted.

In the conventional camera module manufactured by the COB method, since the lens barrel and the housing are coupled through the screw portions, the screw adjustment should be performed so as to adjust a focal distance. Accordingly, foreign matters may occur during the screw adjustment. In this embodiment, however, since the housing 42 is adjusted in a sliding manner, it is possible to minimize foreign matters.

Third Embodiment

FIG. 5 is a cross-sectional view of a camera module 50 according to a third embodiment of the present invention.

In this embodiment, the descriptions of the same technical construction as those of the first and second embodiments will be omitted, and like reference numerals will be attached to the same components.

The housing 42 further includes a support portion 42*b* which extends from an inner lower end of the housing 42 so as to come in contact with the upper end of the holder assembly. That is, the housing 42 further includes the cylindrical support portion 42*b* formed at the inner lower end thereof. The support portion 42*b* may be disposed on the upper end of the IR filter 34.

As the support portion 42*b* is adopted, the housing 42 and the holder assembly 30 can be coupled more reliably. Further, when the housing 42 is coupled, the housing 42 can be inserted into the holder 31 without a separate height adjustment process. In other words, the height of the support portion 42*b* is determined after a desirable focal distance is previously calculated. Then, the housing 42 can be inserted into the holder 31 without a separate height adjustment process. Therefore, it is possible to prevent an image error caused by 'tilting' when the image sensor module and the housing are coupled.

Fourth Embodiment

FIG. 6 is a cross-sectional view of a camera module 60 according to a fourth embodiment of the invention.

In this embodiment, the descriptions of the same technical construction as those of the first to third embodiments will be omitted, and like reference numerals will be attached to the same components.

First, a filter mounting portion 37*a* is formed on the inner surface of a middle portion of the holder 31 of the holder assembly 30.

For the bonding media 35, pads may be used instead of solder balls. Like the solder balls, the pads reliably bond the holder assembly 30 to the main substrate 41, while an adhesive provided on the lower ends of the pads is molten during a high-temperature reflow process. Therefore, it is possible to simplify the manufacturing process, as in the reflow process using the solder balls.

Method of Manufacturing Camera Module

Hereinafter, a method of manufacturing a camera module according to an embodiment of the present invention will be described.

In this embodiment, the descriptions of the same technical construction as those of the first to fourth embodiments will be omitted, and like reference numerals will be attached to the same components.

First, a holder assembly 30 is manufactured. Then, a main substrate 41 is bonded to the holder assembly 30 through a reflow process, and a housing 42 is mounted on the upper end portion of the holder assembly 30. Since a general reflow process is performed at a high temperature of about 250° C., the housing formed of plastic such as PVC is mounted on the holder assembly 30 after the reflow process.

The holder assembly 30 is manufactured by the following process.

First, bonding media 35 for bonding the main substrate 40 through a reflow process are provided on the lower surface of a holder substrate 32 composing the lower end portion of the holder assembly 30, and an image sensor 33 is mounted on the upper surface of the holder substrate 32 (refer to FIG. 7A) and is fixed through wire bonding (refer to FIG. 7B). For the bonding media 35, solder balls or pads may be used.

Then, a holder 31 formed of a ceramic material having thermal resistance is mounted on the holder substrate 32 so as to surround the image sensor 33 wire-bonded on the holder substrate 32 (refer to FIG. 7C). Since the holder 31 is formed of a ceramic material, it can endure high-temperature heat generated during a reflow process.

Next, a housing mounting portion 36 on which a housing 42 is to be mounted is provided on the upper end portion of the holder 31 along the circumferential surface of the holder 31. Further, a filter mounting portion 37 on which an IR filter is to be mounted is provided along the inner circumferential surface of the upper end portion of the holder 31. When the IR filter 34 is mounted, an adhesive such as UV bond may be used.

As the upper end portion of the holder 31 is sealed by the IR filter 34, the IR filter 34 may serve as a cover glass for protecting the expensive image sensor 33 from external contaminants which may occur during a variety of processes to be subsequently performed (refer to FIG. 7D).

Before the holder assembly 30 is bonded to the main substrate 41, passive elements 38 are provided on the holder substrate 32 so as to be positioned outside the holder 31 (refer to FIG. 7E). The passive elements 38 may be provided on the upper end portion of the holder 31 as well as the holder substrate 32 (not shown).

The holder assembly 30 constructed in such a manner is bonded to the main substrate 41 through a reflow process (refer to FIG. 7F). At this time, since a plurality of holder assemblies can be bonded to a plurality of main substrates through one process, it is possible to simplify the manufacturing process. Further, since the holder assembly 30 is previously manufactured, it is possible to quickly respond to users' requests, thereby reducing the manufacturing time. That is because, since a proper quantity of main substrates 41 are bonded through the reflow process in accordance with users' requests, mass production can be achieved.

After the holder assembly 30 and the main substrate 41 are bonded to each other, the housing 42 is mounted on the housing mounting portion 36 of the holder assembly 30 in a sliding manner. While the housing 42 is slowly slid into the housing mounting portion 36 of the holder assembly 30, fine focus adjustment is performed (refer to FIG. 7G). Therefore, it is possible to minimize foreign matters which have occurred during the screw adjustment in the conventional screw coupling method.

According to the present invention, defects caused by foreign matters can be minimized. Further, since the holder assembly is previously manufactured, it is possible to quickly respond to users' requests. Further, since the reflow process is adopted, the manufacturing process can be simplified, and throughput can be enhanced. Further, when defects occur in the camera module, a rework operation can be easily performed, and the image sensor can be reused, which makes it possible to reduce the manufacturing cost.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a camera module, the camera module including a housing that includes one or more lenses which are sequentially fixed and coupled and of which the focus does not need to be adjusted, a holder assembly that is coupled to a lower end portion of the housing and a main substrate that is coupled to a lower end portion of the holder assembly, the method comprising:

providing bonding media for bonding the main substrate through a reflow process such that the bonding media are disposed on a lower surface of a holder substrate composing the lower end portion of the holder assembly, and fixing an image sensor on an upper surface of the holder substrate through wire bonding;

mounting a holder formed of a ceramic material so as to surround the image sensor wire-bonded to the holder substrate;

mounting an IR filter on the holder so as to seal an internal space of the holder, which is defined by the holder substrate and the holder and in which the image sensor is included, thereby completely manufacturing the holder assembly;

bonding the holder assembly to the main substrate through a reflow process; and performing fine focus adjustment while sliding the housing into the housing mounting portion formed at the upper end portion of the holder body coupled to the main substrate, wherein the housing includes a support portion which extends from an inner lower end of the housing so as to come in contact with the upper end portion of the holder assembly.

2. The method according to claim 1, wherein the support portion is provided so as to be disposed on an upper end portion of the IR filter.

3. The method according to claim 1, further comprising:

providing passive elements on the holder substrate such that the passive elements are positioned outside the holder, before the bonding of the holder substrate to the main substrate.

* * * * *